United States Patent [19]
Cooper et al.

[11] Patent Number: 6,078,204
[45] Date of Patent: Jun. 20, 2000

[54] HIGH CURRENT DRAIN-TO-GATE CLAMP/ GATE-TO-SOURCE CLAMP FOR EXTERNAL POWER MOS TRANSISTORS

[75] Inventors: Chris Cooper, Denison; Katherine Frank; David Baldwin, both of Allen, all of Tex.

[73] Assignee: Texas Instruments Incorporated, Dallas, Tex.

[21] Appl. No.: 08/992,269

[22] Filed: Dec. 17, 1997

Related U.S. Application Data

[60] Provisional application No. 60/033,690, Dec. 19, 1996.

[51] Int. Cl.[7] ........................................ H03K 5/08
[52] U.S. Cl. ......................... 327/309; 327/318; 327/320
[58] Field of Search .................... 327/309, 318, 327/319, 320, 321, 322, 324, 325, 327, 328; 361/91

[56] References Cited

U.S. PATENT DOCUMENTS

| | | | |
|---|---|---|---|
| 5,793,245 | 8/1998 | Marshall et al. | 327/389 |
| 5,801,573 | 9/1998 | Kelly et al. | 327/434 |
| 5,812,006 | 9/1998 | Teggatz et al. | 327/309 |
| 5,828,141 | 10/1998 | Foerster | 307/125 |

*Primary Examiner*—Tuan T. Lam
*Assistant Examiner*—Hai L. Nguyen
*Attorney, Agent, or Firm*—April M. Mosby; W. James Brady

[57] ABSTRACT

An external FET (12) has protection provided thereto for excessive voltages between the gate and drain and between the gate and source. A drain-to-gate clamp is provided with a plurality of series connected zener diodes (34), (36) and (38) which are connected in series with a Schottky diode (42). The current therethrough is sensed with a resistor (56) which turns on a bypass transistor (58) to shunt current around the zener diodes when an excess voltage causes them to break down. This will turn on the FET (12). The gate-to-source clamp is configured with two zener diodes (74) and (76) which are reversed biased. A series current sense resistor (82) senses the current through the diodes and turns on a transistor (84) when the current exceeds a predetermined level. This will effectively shunt current around the zener diodes (74) and (76).

20 Claims, 2 Drawing Sheets

6,078,204

HIGH CURRENT DRAIN-TO-GATE CLAMP/ GATE-TO-SOURCE CLAMP FOR EXTERNAL POWER MOS TRANSISTORS

This application claims priority under 35 USC § 119(e)(1) of provisional application No. 60/033,690 filed Dec. 19, 1996.

TECHNICAL FIELD OF THE INVENTION

The present invention pertains in general to protection circuitry and, more particularly, to a clamp circuit that can be utilized between the gate and drain or between the gate and source of an external power MOS transistor.

BACKGROUND OF THE INVENTION

In power applications involving an integrated circuit control element, an inductive load is typically driven by a power field effect transistor (FET). When the transistor is turned off, the inductive load will have a fly-back voltage associated therewith due to the inductive storage of energy therein. This fly-back will cause the voltage on the drain of an N-channel FET utilized for the driving element to rise to a relatively high level. These FETs can be damaged by flyback-induced voltage excursions that rise to a level above the junction breakdown of the FET.

In order to protect the FET, a clamp circuit is typically connected between the drain and gate of the FET. When the voltage on the drain of the FET rises to a sufficiently high level, current will conduct through the clamp, pulling the gate of the FET high and turning on the FET, this effectively preventing the fly-back voltage from pulling the drain above the clamp voltage. These clamp circuits utilized in the prior art circuits consisted of a series of zener diodes, each having a breakdown voltage that, when added together, comprise the overall threshold voltage for the clamp.

One disadvantage to prior art clamp circuits is the current level that must be accommodated by the clamp. Whenever the fly-back voltage pulls the drain of the FET high, current will flow from the drain to the gate, some passing through the driving circuit that drives the FET. This is a finite amount of current, which can be sufficiently high to require relatively robust components in the clamp. However, the design of a clamp circuit that will accommodate the necessary levels current require relatively large devices. This can become a disadvantage in that the clamp circuits are typically incorporated into the integrated circuit output that drives the FET.

SUMMARY OF THE INVENTION

The present invention disclosed and claimed herein comprises a clamp circuit for being disposed between the gate and one of the source/drain terminals of an external power transistor. The clamp circuit is operable to prevent a large voltage from being impressed across the gate oxide of the external transistor. The clamp circuit includes a threshold device having a high voltage side and a low voltage side for conducting current between the gate and the one of the source/drain terminals of the external transistor when the voltage thereacross exceeds a first threshold voltage. A current bypass device is associated with the threshold device for bypassing a portion of the current from the high voltage side to the low voltage side of the threshold device. This current bypass circuit is operable whenever the current through the threshold device exceeds a predetermined bypass current threshold.

In a further aspect of the present invention, the clamp circuit includes a blocking diode disposed in series with the threshold device to block current from passing from the low voltage side to the high voltage side of the threshold device. The threshold device includes one or more zener diodes oriented with the cathode thereof directed toward the high voltage side and the anodes thereof directed toward the low voltage side.

In a yet further aspect of the present invention, the current bypass circuit consists of a bypass transistor with the source/drain path thereof connected between the high voltage and low voltage sides of the threshold device. The gate of the bypass transistor is controlled by a gate control device that turns on the bypass transistor whenever the current to the threshold device exceeds the first threshold voltage. This gate control circuit is comprised of a resistor disposed in series with the threshold device, such that when the voltage thereacross rises above the threshold voltage of the transistor, the transistor conducts.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
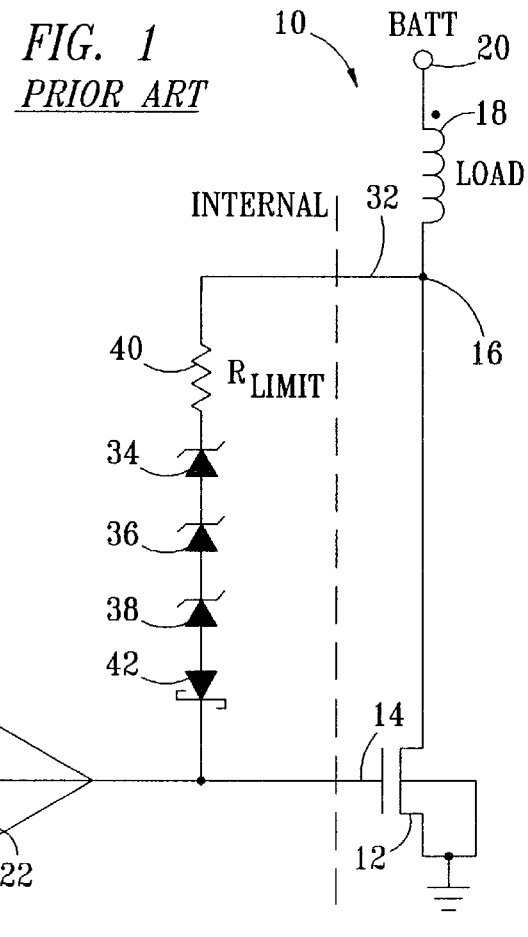
FIG. 1 illustrates a prior art drain-to-gate clamp.

Referring now to FIG. 1, there is illustrated a schematic diagram of a prior art drain-to-gate clamp. An integrated circuit is defined on one side of a phantom line 10, for driving an external power FET 12 through an output terminal 14, which output terminal 14 is connected to the gate of the FET 12. The drain of the FET 12 is connected to a node 16 and the source thereof is connected to ground. The node 16 is operable to drive one side of a load inductance 18, the other side of the load inductance 18 connected to a battery terminal 20.

The output terminal 14 is driven by a driver circuit 22. The driver circuit 22 is provided with two current sources, a first current source 24 for driving current to the output terminal 14 from a positive supply rail 26, which positive supply rail 26 is an internal power supply separate from the battery terminal 20, and a second current source 28 for sinking current from the output terminal 14. The driving circuit 22 receives an input signal on an input 30, which input signal has a high logic state and a low logic state. In the high logic state, the current source 28 is turned on and in the low logic state, the current source 24 is turned on. This driver circuit 22 is a conventional driver circuit.

The prior art clamp circuit is disposed between the output of the driver 22 and the output node 16, the output node 16 connected to an output terminal 32. The clamp is comprised of three zener diodes 34, 36 and 38, each having the cathodes thereof oriented toward the node 16, with the cathode of zener diode 36 connected to the anode of zener diode 34 and the cathode of zener diode 38 connected to the anode of zener diode 36. The cathode of zener diode 34 is connected to one side of a limit resistor 40, the other side thereof connected to the output terminal 32. The anode of zener diode 38 is connected to the anode of a Schottky diode 42, the cathode thereof connected to the output of driver 22.

In operation, when the voltage on node 16 rises to a level that exceeds the sum of the zener breakdown voltage of the zener diodes 34–38, current will flow through these diodes. This, of course, will forward bias diode 42. The limit resistor 40 provides some limitation on the current that can pass through the diodes 34–38 and the Schottky diode 42. However, it is noted that, when the FET 12 is turned off, current source 28 is turned on. This results in current path to ground from the output terminal 14. The current will pass through the diodes 34, 36, 38 and 42. Therefore, the diodes must be of sufficient size to handle this level of current.

Figure 2:
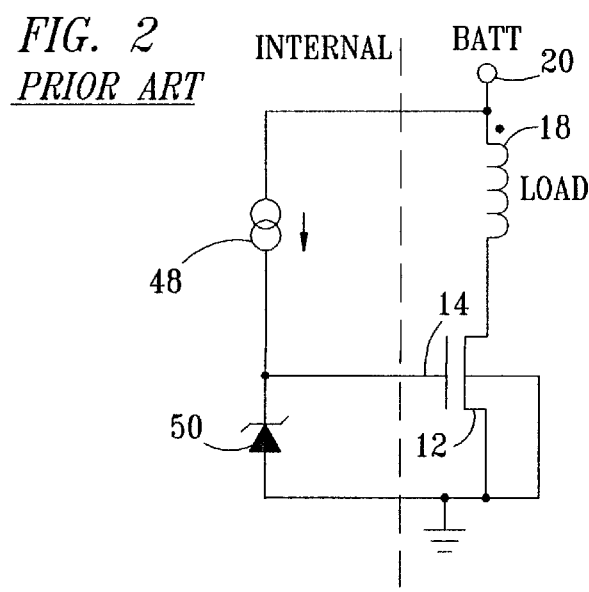
FIG. 2 illustrates a prior art gate-to-source clamp.

Referring now to FIG. 2, there is illustrated a schematic of a prior art gate-to-source clamp. In this configuration, the output terminal 14 is illustrated as being driven by a current source 48, which is connected between the battery terminal 20 and the output terminal 14. In order to protect the gate of the transistor 14 from being pulled high in what is referred to as a "double battery condition", a zener diode 50 is connected between the output terminal 14 and ground, with the cathode of diode 50 connected to the output terminal 14. Therefore, the current through current source 48 will pass through zener diode 50. Again, the zener diode 50 must be of sufficient size to accommodate the current from the current source 48.

Figure 3:
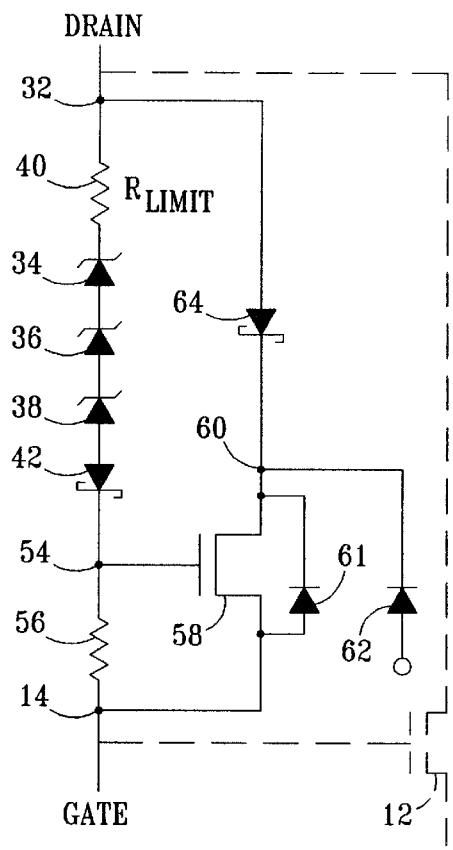
FIG. 3 illustrates the embodiment of the drain-to-gate clamp of the present invention.

Referring now to FIG. 3, there is illustrated a schematic diagram of the drain-to-gate clamp of the present invention for one embodiment thereof, the FET 12 illustrated in phantom. The clamp utilizes the limit resistor 40, the zener diodes 34–38 and the Schottky diode 42, with the exception that they can be sized differently with respect to their power handling capability, as will be described hereinbelow. The cathode of the Schottky diode 42 is connected to a node 54, node 54 connected to one side of a resistor 56, the other side thereof connected to the output terminal 14. An N-channel transistor 58 has the gate thereof connected to the node 54, the source thereof connected to the output terminal 14 and the drain thereof connected to a node 60. The transistor 58 is oriented such that the body effect diode 61 is oriented with the cathode thereof connected to node 60 and the anode thereof connected to output terminal 14. Additionally, a drain-to-substrate diode 62 is formed with the cathode thereof connected to the node 60 and the anode thereof connected to the substrate. A Schottky diode 64 is connected between the drain output terminal 32 and the node 60, with the anode thereof connected to the drain output terminal 32 and the cathode thereof connected to the node 60.

In operation, the drain-to-gate clamp of FIG. 3 operates to bypass the zener diodes 34–38 and the Schottky diode 42 whenever the current through resistor 56 exceeds the $V_T$ voltage of the transistor 58. Transistor 58 will then turn on and current will pass through transistor 58. The portion of the current passing through transistor 58 is a function of the size of the resistor 56. The Schottky diode 64 is necessary to prevent the body diode 61 of transistor 58 from becoming forward biased during the normal "on" state of the external FET 12. Although not illustrated, this Schottky diode 64 could be directly incorporated into the transistor 58 by removing the drain NSD implant.

Figure 4:
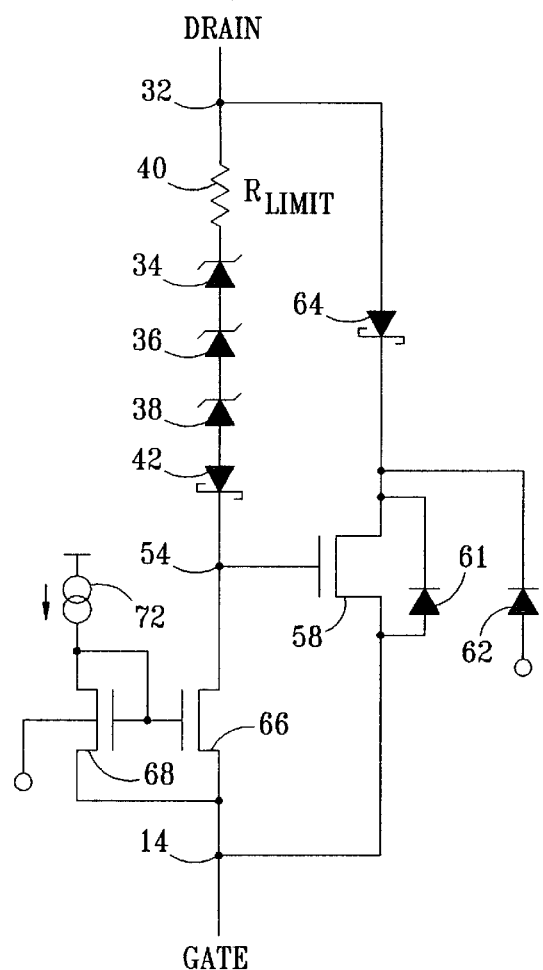
FIG. 4 illustrates an alternate embodiment of the drain-to-gate clamp of the present invention.

Referring now to FIG. 4, there is illustrated an alternate embodiment of the drain-to-gate clamp of FIG. 3, with the resistor 56 replaced by a current mirror. The current mirror is comprised of an N-channel transistor 66, having the source thereof connected to the output terminal 14, the drain thereof connected to the node 54 and the gate thereof connected to the gate of an N-channel transistor 68. Transistor 68 has the drain thereof connected to the gate and the source thereof connected to the output terminal 14. The source of transistor 68 is connected to the node 14, with the drain thereof connected to the output of a current source 72. This current source presents a fairly large impedance which will function substantially similar to the resistor 56.

Figure 5:
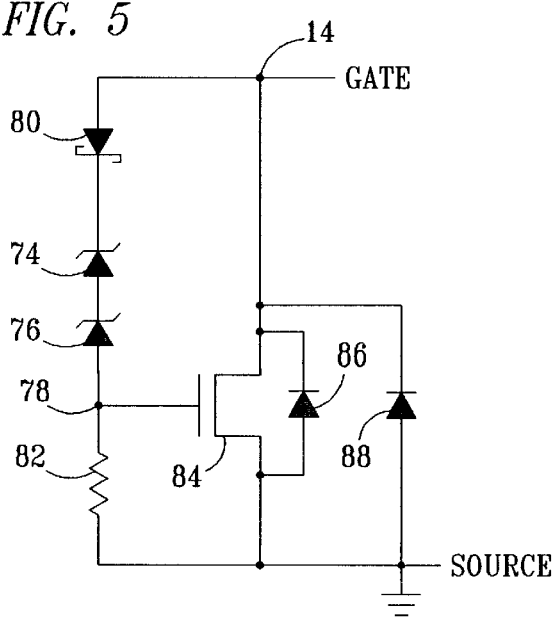
FIG. 5 illustrates a schematic diagram of the gate-to-source clamp of the present invention.

Referring now to FIG. 5, there is illustrated a schematic diagram of a gate-to-source clamp in accordance with the present invention. The clamp is comprised of two zener diodes 74 and 76, with the anode of zener diode 74 connected to the cathode of zener diode 76. The anode of zener diode 76 is connected to a node 78 and the cathode of the zener diode 74 is connected to the cathode of a Schottky diode 80, the anode thereof connected to the output terminal 14. The node 78 is connected to one side of a resistor 82, the other side thereof connected to ground. An N-channel transistor 84 has the gate thereof connected to the node 78, the source thereof connected to ground and the drain thereof connected to the output terminal 14. A body effect diode 86 is associated with transistor 84 and oriented such that the anode thereof is connected to ground and the cathode thereof is connected to the output terminal 14. A drain-to-substrate diode 88 is connected between output terminal 14 and the substrate in association with the transistor 84 with the cathode thereof connected to the node 14.

In operation, the gate-to-source clamp will be non-conductive as long as the voltage is less than the combined zener breakdown voltages of the two zener diodes 74 and 76. When the voltage exceeds the sum of these two zener breakdown voltages, the diode 80 will conduct and pass current through the resistor 82. When the voltage across the resistor 82 equals or exceeds the $V_T$ threshold voltage of transistor 84, transistor 84 turns on and pulls current from node 14, bypassing diode 74 and 76. This, therefore, allows lower power diodes to be incorporated therein.

Figure 6:
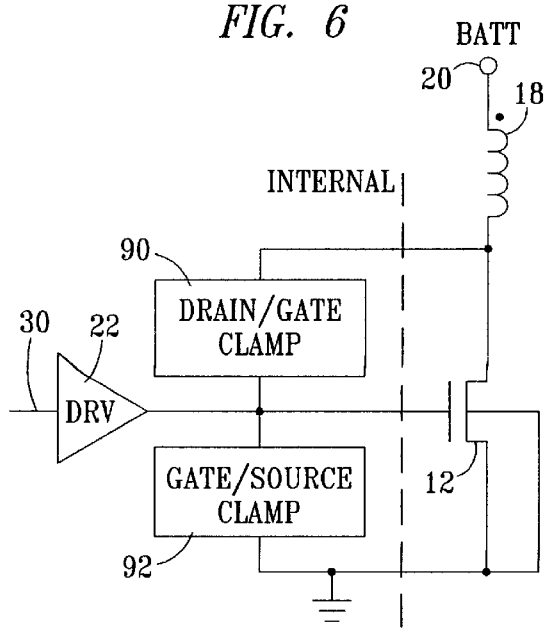
FIG. 6 illustrates one application of the drain-to-gate clamp and the gate-to-source clamp.

Referring now to FIG. 6, there is illustrated a block diagram of one application of the clamping circuits of the present invention. The transistor is configured such that, internal to the integrated circuit, a drain/gate clamp 90 is connected between the drain of transistor 12 and the gate thereof. A gate/source clamp 92 is connected between the gate and source of transistor 12. The drain/gate clamp 90 is similar as that described above with respect to FIGS. 3 and 4 and the gate/source clamp is that as described above with respect to FIG. 5.

Although the preferred embodiment has been described in detail, it should be understood that various changes, substitutions and alterations can be made therein without departing from the spirit and scope of the invention as defined by the appended claims.

What is claimed is:

1. A clamp circuit for being disposed between the gate and one of the source/drain terminals of an external transistor for preventing a large voltage from being impressed across the gate oxide of the external transistor, comprising:

a threshold device having a high voltage side and a low voltage side for conducting current between the gate and the one of the source/drain terminals of the external transistor when the voltage thereacross exceeds a first threshold voltage to prevent the voltage thereacross from rising substantially above the first threshold voltage; and a current bypass circuit for bypassing a portion of the current from the high voltage side of the threshold device to the low voltage side thereof when the current through said threshold device rises above a predetermined bypass current threshold.

2. The clamp circuit of claim 1, wherein said threshold device comprises at least a single zener diode oriented such that the cathode thereof is connected to the high voltage side of said threshold device and the anode thereof is connected to the low voltage side of said threshold device.

3. The clamp circuit of claim 2, and further comprising a plurality of zener diodes connected in series such that the reverse breakdown voltages are cumulative to provide said first threshold voltage.

4. The clamp circuit of claim 1, wherein said current bypass circuit comprises a bypass transistor and a bypass gate control circuit, said bypass transistor having the source/drain path thereof connected between the high voltage and low voltage sides of said threshold device and the gate thereof connected to said bypass gate control circuit said bypass control circuit connected between the high voltage and low voltage sides of said threshold device which is operable to turn on said bypass transistor when the current through said threshold device rises above said bypass current threshold.

5. The clamp circuit of claim 4, wherein said threshold device comprises a plurality of zener diodes configured in series with the cathodes thereof oriented toward said high voltage side of said threshold device and the anodes thereof oriented toward said low voltage side of said threshold device such that the breakdown voltages thereof are cumulative to provide said first threshold voltage.

6. The clamp circuit of claim 5, wherein said bypass gate control circuit comprises an impedance disposed in series with said plurality of zener diodes such that when the current therethrough raises the voltage thereacross to at least the threshold voltage of said bypass transistor, said bypass transistor will conduct.

7. The clamp circuit of claim 1, wherein said threshold device is disposed between the gate and the source of the external transistor.

8. The clamp circuit of claim 1, wherein said threshold device is disposed between the gate and the drain of the external transistor.

9. A method for protecting the gate oxide in an external transistor, comprising the steps of:
determining when the voltage between the gate and one of the source/drain terminals of the external transistor exceeds a first threshold voltage;
conducting current between the gate and the one of the source/drain terminals of the external transistor through a first current path, having active devices associated therewith and a high voltage side and a low voltage side, when the voltage has been determined to exceed the first threshold voltage and preventing the voltage thereacross from rising substantially above the first threshold voltage;
determining when the current through the first current path exceeds a predetermined bypass current threshold; and
bypassing the current around the first current path having the active devices therein through a second bypass current path such that the current through the first current path is limited to a predetermined level.

10. The method of claim 9, and further comprising the steps of preventing current flow from the low voltage side to the high voltage side of the first current path.

11. The method of claim 9, wherein the active devices in the first current path comprises at least a single zener diode oriented such that the cathode thereof is connected to the high voltage side of the first current path and the anode thereof is connected to the low voltage side of the first current path.

12. The method of claim 11, wherein the first current path comprises a plurality of zener diodes connected in series such that the reverse breakdown voltages thereof are cumulative to provide the first threshold voltage.

13. The method of claim 9, wherein the step of bypassing current includes the steps of disposing the source/drain path of a bypass transistor in parallel with the first current path and controlling the gate thereof to turn on the bypass transistor when the current through the first current path rises above a bypass current threshold.

14. The method of claim 13, wherein the active devices in the first current path comprise a plurality of zener diodes configured in series, with the cathodes thereof oriented toward the high voltage side of the first current path and the anodes thereof oriented toward the low voltage side of the first current path, such that the breakdown voltages thereof are cumulative to provide the first threshold voltage.

15. The method of claim 13, wherein the step of controlling the gate of the bypass transistor comprises disposing an impedance in series with the active devices in the first current path such that, when the current through the first current path rises above the voltage across the impedance device to at least the threshold voltage of the bypass transistor, the bypass transistor will conduct.

16. The method of claim 9, wherein the first current path is disposed between the gate and source of the external transistor.

17. The method of claim 9, wherein the first current path is disposed between the gate and drain of the external transistor.

18. A circuit, comprising:
a first transistor having gate, source, and drain terminals;
a first threshold circuit having a first terminal coupled to said drain terminal of said first transistor and a second terminal;
a first impedance coupled between said second terminal of said first threshold circuit and said gate terminal of said first transistor;
a first current bypass transistor having a source/drain current path coupled between said gate and drain terminals of said first transistor and a gate coupled to a node between said first threshold circuit and said first impedance;
wherein said first threshold circuit blocks current when a voltage at said drain terminal of said first transistor is less than a first threshold voltage and conducts current to turn said first transistor on when the voltage at said drain terminal of said first transistor exceeds said first threshold voltage and said first current bypass transistor turns on to bypass a portion of the current through said first threshold circuit when the current through said first threshold circuit exceeds a first current threshold.

19. The circuit of claim 18, wherein said first threshold circuit comprises at least a single zener diode having a cathode coupled to said drain terminal of said first transistor.

20. The circuit of claim 18, further comprising:
a second threshold circuit having a first terminal coupled to said gate terminal of said first transistor and a second terminal;
a second impedance coupled between said second terminal of said second threshold circuit and said source terminal of said first transistor;

a second current bypass transistor having a source/drain current path coupled between said gate and source terminals of said first transistor and a gate coupled to a node between said second threshold circuit and said second impedance;

wherein said second threshold circuit blocks current when a voltage at said gate terminal of said first transistor is less than a second threshold voltage and conducts current when the voltage at said gate terminal of said first transistor exceeds said second threshold voltage and said second current bypass transistor turns on to bypass a portion of the current through said second threshold circuit when the current through said second threshold circuit exceeds a second current threshold.

* * * * *